United States Patent [19]

Marrs

[11] Patent Number: 5,478,007
[45] Date of Patent: Dec. 26, 1995

[54] METHOD FOR INTERCONNECTION OF INTEGRATED CIRCUIT CHIP AND SUBSTRATE

[75] Inventor: Robert C. Marrs, Scottsdale, Ariz.

[73] Assignee: Amkor Electronics, Inc., Chandler, Ariz.

[21] Appl. No.: 241,427

[22] Filed: May 11, 1994

Related U.S. Application Data

[62] Division of Ser. No. 47,329, Apr. 14, 1993, abandoned.

[51] Int. Cl.$^6$ .......................... H01L 21/607; H01L 21/98
[52] U.S. Cl. .................................. 228/180.22; 228/111.5; 228/175; 437/183
[58] Field of Search .......................... 228/180.22, 180.5, 228/111.5, 175; 437/209, 183

[56] References Cited

U.S. PATENT DOCUMENTS

| | | | |
|---|---|---|---|
| 3,373,481 | 3/1968 | Lins et al. | 228/180.22 X |
| 3,429,040 | 2/1969 | Miller | 257/780 |
| 3,838,984 | 10/1974 | Crane et al. | 29/193.5 |
| 4,074,342 | 2/1978 | Honn et al. | 361/411 |

(List continued on next page.)

FOREIGN PATENT DOCUMENTS

| | | |
|---|---|---|
| 57-143838 | 9/1982 | Japan . |
| 58-97849 | 6/1983 | Japan . |
| 58-157147 | 9/1983 | Japan . |
| 58-148434 | 9/1983 | Japan . |
| 59-5639 | 1/1984 | Japan . |
| 59-31042 | 2/1984 | Japan . |
| 59-35439 | 2/1984 | Japan . |
| 59-40539 | 3/1984 | Japan . |
| 59-208751 | 11/1984 | Japan . |
| 60-89951 | 5/1985 | Japan . |
| 60-94744 | 5/1985 | Japan . |
| 62-67829 | 3/1987 | Japan . |

(List continued on next page.)

OTHER PUBLICATIONS

"Flip Chip Technology, The Interconnect Method of the 90's," Technology Impact Report, Jun. 1992, Prepared by International Interconnection Intelligence, Montara, Calif. 94037.
"Encapsulated Solder Joint For Chip Mounting," IBM Technical Disclosure Bulletin, vol. 32, No. 10B, Mar. 1990, p. 480.
"Metallurgical System For C4 Joint BLM," IBM Technical Bulletin, vol. 27, No. 9, Feb. 1985, p. 5212.
"Chip–To–Package Interconnections," Nicholas G. Koopman, Microelectronics Packaging Handbook, 1989, pp. 361–391.

*Primary Examiner*—Kenneth J. Ramsey
*Attorney, Agent, or Firm*—Skjerven, Morrill, MacPherson, Franklin & Friel; Thomas S. MacDonald; Philip J. McKay

[57] ABSTRACT

According to the invention, a method and structure for flip chip interconnection of an integrated circuit chip to a substrate is provided. The method and structure of the invention overcome the problems associated with interconnecting the chip to the substrate by wirebonding and are less expensive than prior art flip chip interconnection methods and structures. Conventional integrated circuit chips that have been made using wafer fabrication processes for wirebonding chip-level interconnection are electrically connected to a substrate using a flip chip interconnection. Conventional wirebonding equipment can be used to bump chips for use in the invention. In one embodiment of the invention, an integrated circuit includes a semiconductor die mounted on a substrate such that electrically conductive material formed on each of the bond pads of the semiconductor die extends through a corresponding well formed in a dielectric layer on the substrate to contact electrically conductive material formed in the surface of the substrate on which the dielectric layer is situated. In another embodiment of the invention, the electrically conductive material is a coined ball bond, which can have, for instance, a conical section on top of a base section. The wells can be formed by any of a number of methods such as mechanical drilling, laser drilling, chemical etching or plasma etching.

13 Claims, 9 Drawing Sheets

U.S. PATENT DOCUMENTS

| | | | |
|---|---|---|---|
| 4,352,120 | 9/1982 | Kurihara et al. | 357/81 |
| 4,617,730 | 10/1986 | Geldermans et al. | 257/697 |
| 4,818,728 | 4/1989 | Rai et al. | 437/209 |
| 4,825,284 | 4/1989 | Soga et al. | 357/80 |
| 4,926,241 | 5/1990 | Carey | 357/75 |
| 4,955,523 | 9/1990 | Carlomagno et al. | 228/180.22 X |
| 4,967,313 | 10/1990 | Berner | 361/400 |
| 4,967,950 | 11/1990 | Legg et al. | 228/160.2 |
| 4,974,057 | 11/1990 | Tazima | 357/72 |
| 5,010,389 | 4/1991 | Gansauge et al. | 257/738 |
| 5,046,238 | 9/1991 | Daigle et al. | 361/792 X |
| 5,056,216 | 10/1991 | Madou et al. | 228/180.22 X |
| 5,071,787 | 12/1991 | Mori et al. | 437/183 |
| 5,086,966 | 2/1992 | Melton et al. | 228/208 |
| 5,088,007 | 2/1992 | Missele | 361/386 |
| 5,105,259 | 4/1992 | McShane et al. | 257/675 |
| 5,111,279 | 5/1992 | Pasch et al. | 357/81 |
| 5,116,228 | 5/1992 | Kabeshita et al. | 228/180.22 X |
| 5,118,370 | 6/1992 | Osawa et al. | 228/110 |
| 5,147,084 | 9/1992 | Behun et al. | 228/563 |
| 5,203,075 | 4/1993 | Angulas et al. | 228/180.22 X |
| 5,229,647 | 7/1993 | Gnadinger | 257/680 |
| 5,249,450 | 10/1993 | Wood et al. | 72/359 |
| 5,306,664 | 4/1994 | Sakura | 437/183 |

FOREIGN PATENT DOCUMENTS

| | | | |
|---|---|---|---|
| 62-281435 | 12/1987 | Japan. | |
| 63-164343 | 7/1988 | Japan. | |
| 63-241955 | 10/1988 | Japan. | |
| 63-275127 | 11/1988 | Japan. | |
| 63-288031 | 11/1988 | Japan. | |
| 63-316447 | 12/1988 | Japan. | |
| 64-44049 | 2/1989 | Japan. | |
| 73626 | 3/1989 | Japan | 437/183 |
| 1-161850 | 6/1989 | Japan. | |
| 1-140766 | 6/1989 | Japan. | |
| 1-191457 | 8/1989 | Japan. | |
| 1-217935 | 8/1989 | Japan. | |
| 1-217936 | 8/1989 | Japan. | |
| 1-243533 | 9/1989 | Japan. | |
| 2-132836 | 5/1990 | Japan. | |
| 2-189926 | 7/1990 | Japan. | |
| 2-246236 | 10/1990 | Japan. | |
| 2-249248 | 10/1990 | Japan. | |
| 2-150042 | 12/1990 | Japan. | |
| 243135 | 8/1992 | Japan | 437/183 |

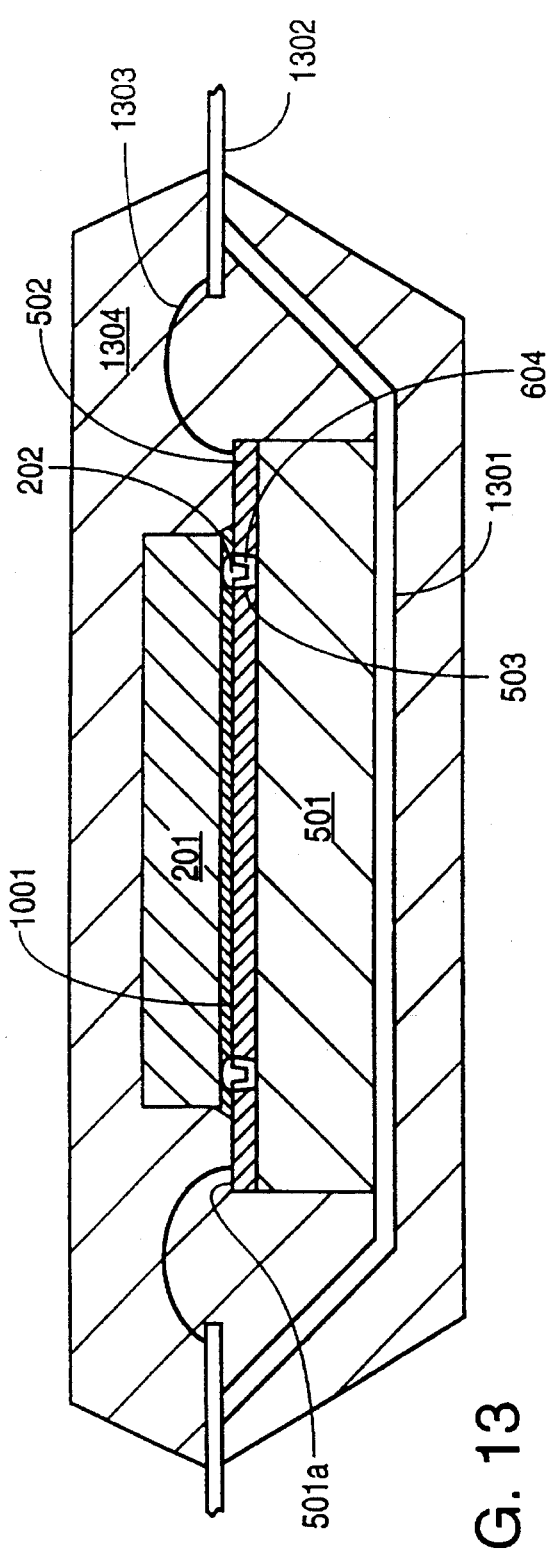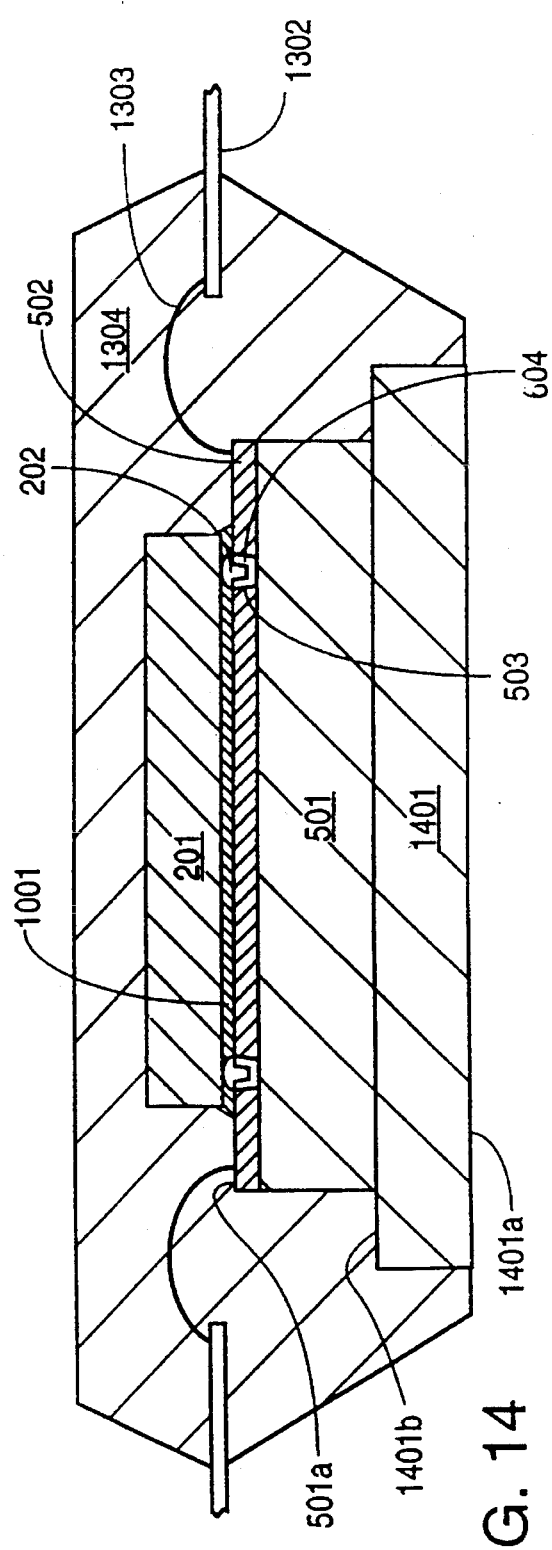

METHOD FOR INTERCONNECTION OF INTEGRATED CIRCUIT CHIP AND SUBSTRATE

This application is a division of application Ser. No. 08/047,329, filed Apr. 14, 1993, now abandoned.

BACKGROUND OF THE INVENTION

1. Field of the Invention

This invention relates to integrated circuits and, in particular, to the electrical interconnection of integrated circuit chips to other electronic components and electrically conductive material. Most particularly, the invention relates to the interconnection of an integrated circuit chip and substrate in which electrically conductive traces, vias, and/or regions are formed.

2. Related Art

In current integrated circuit technology, there are three primary methods for routing electrical signals to and from an integrated circuit chip (a semiconductor die in which electrically conductive circuitry is formed) in a packaged integrated circuit. These three methods of chip-level interconnection are wirebonding, tape automated bonding (TAB), and controlled collapse chip connection (C4). Currently, wirebonding is used in approximately 97% of packaged integrated circuits, because wirebonding is inexpensive relative to the other two methods, and because wirebonding machines are programmable, thus enabling many different integrated circuit chip types to be quickly and easily interconnected to a variety of package options.

In wirebonding, one end of an electrically conductive wire (bond wire) is attached to a bond pad (which is electrically connected to the circuitry on the chip) on the integrated circuit chip. The other end of the wire is attached to an off-chip bonding location to which it is desired to make electrical connection such as, for example, an end of an electrically conductive lead or a bonding contact on a substrate. A plurality of bond wires are used in this manner to connect selected bond pads on the chip to selected off-chip bonding locations.

Wirebonding has some disadvantages. Each bond wire adds inductance and capacitance that create noise in the electrical signals traveling to and from the chip through the bond wire. Further, the bond wires typically arc from the bond pads to the off-chip bonding location so that the profile (thickness) of the packaged integrated circuit is thicker than it need necessarily be. Additionally, there is some distance between the chip and the off-chip bonding location over which the bond wires extend so that the density with which chips can be placed on a substrate of, for instance, a multichip module is less than is ideally desirable. Finally, bond wire sweep (i.e., displacement of bond wires that may occur during and as a result of the process for encapsulating the chip) may result in undesirable electrical shorting between adjacent bond wires.

TAB partially overcomes these problems by eliminating bond wires and making direct connection between the bond pads on the chip and the inner end of each of a set of leads that are formed in an electrically insulative tape. Bond wire sweep and undesirably large package profile are no longer problems, but, since leads are still present, electrical noise due to lead inductance and capacitance is still undesirably large and chip density in multichip modules is not as small as possible. Further, TAB is expensive to implement.

The C4 interconnection method overcome the wirebonding problems by eliminating bond wires and leads, thus making an even more direct connection between the bond pads on the chip and the off-chip bonding locations. However, the C4 method, like TAB, has been much more expensive to implement than wirebonding.

In a typical C4 interconnection (also known as flip chip interconnection), the bond pads on an integrated circuit chip are solder bumped. Corresponding solder pads are also formed on the off-chip bonding locations on, for instance, a substrate. The chip solder bumps and substrate solder pads are contacted, then heated to reflow the solder. The solder is then cooled to form a bond between the chip and substrate solder.

Prior to being sold to users, bumped chips for use in C4 interconnection undergo processing that is not necessary for chips that are to be wirebonded. In a typical bumping process, after formation of a passivation layer on the chip surface and formation of vias through the passivation layer to the bond pads, successive layers of chromium, copper and gold are formed over the bond pad. A solder bump is then formed over the chromium, copper and gold layers by evaporating or sputtering solder through a mask. This process is relatively difficult and expensive to perform. As a result, bumped chips for use in a typical C4 interconnection are more expensive to produce and are available from fewer sources than chips for use with wirebonding.

SUMMARY OF THE INVENTION

According to the invention, a method and structure for flip chip interconnection of an integrated circuit chip to a substrate is provided. The method and structure of the invention overcome the problems associated with interconnecting the chip to the substrate by wirebonding and are less expensive than prior art flip chip interconnection methods and structures.

Conventional integrated circuit chips that have been made using wafer fabrication processes for wirebonding chip-level interconnection are electrically connected to a substrate using a flip chip interconnection. The wide availability of chips made for wirebonding allows integrated circuits according to the invention to be made for a wide variety of applications. Further, there is no need to maintain a separate inventory of chips for wirebonding and flip chip applications, since chips made for wirebonding are used for both applications. Additionally, since chips for wirebonding applications are typically much cheaper than chips for conventional flip chip applications, the cost of producing chips for flip chip applications is reduced.

Conventional wirebonding equipment can be used to bump chips for use in the invention. This makes production of chips for flip applications according to the invention easier and cheaper than production of conventional flip chips for several reasons. First, conventional wirebonding equipment is cheaper than the equipment used to bump die for a conventional flip chip process. Second, the predominance of wirebonding in the integrated circuit industry means that there is a lot of existing wirebonding equipment that can be used to bump chips for use with the invention. Third, the amount of time to bump chips using conventional wirebonding equipment is less than the time for bumping chips according to the standard flip chip bumping process, thus reducing cost by enabling chips to be processed more quickly.

While being cheaper and easier to implement than the conventional flip chip interconnection, the flip chip interconnection according to the invention also avoids the problems associated with wirebonding chip-level interconnection. Inductances and capacitances associated with bond wires are eliminated, thus reducing electrical noise in signals sent to and from the chip. Further, the profile (i.e., thickness) of the integrated circuit according to the invention is reduced as compared to a comparable wirebonded integrated circuit since the arcing bond wires are eliminated. Additionally, denser packing of chips in multichip modules is possible since the space that, in wirebonded integrated circuits, would otherwise exist between the chip and the off-chip bonding locations (e.g., substrate bonding locations or leads) is not present in the integrated circuits according to the invention. Finally, since bond wires are not present, the possibility of undesirable contact of adjacent bond wires due to bond wire sweep is eliminated.

In one embodiment of the invention, an integrated circuit includes a semiconductor die mounted on a substrate such that electrically conductive material formed on each of the bond pads of the semiconductor die extends through a corresponding well formed in a dielectric layer on the substrate to contact electrically conductive material formed in the surface of the substrate on which the dielectric layer is situated.

In another embodiment of the invention, the electrically conductive material is a coined ball bond, the coined ball bond having a cross-sectional shape such that the width of the cross-section at a first distance above the surface of the die is less than the width of the cross-section at a second distance above the surface of the die, the first distance being greater than the second distance. The coined ball bond can have, for instance, a base section and a protruding section that meets the above restriction. The protruding section may have a conical or a truncated conical shape.

The wells through the dielectric layer on the substrate can be formed by any of a number of methods such as mechanical drilling, laser drilling, chemical etching or plasma etching.

BRIEF DESCRIPTION OF THE DRAWINGS

FIG. 13 is a cross-sectional view of the die and substrate of FIG. 10, with the substrate mounted on a die attach paddle of a leadframe and leads of the leadframe connected by bond wires to bonding locations on the substrate.

FIG. 14 is a cross-sectional view of the die and substrate of FIG. 10, with the substrate mounted on a heat sink and leads connected by bond wires to bonding locations on the substrate.

DETAILED DESCRIPTION OF EMBODIMENTS OF THE INVENTION

Figure 1:
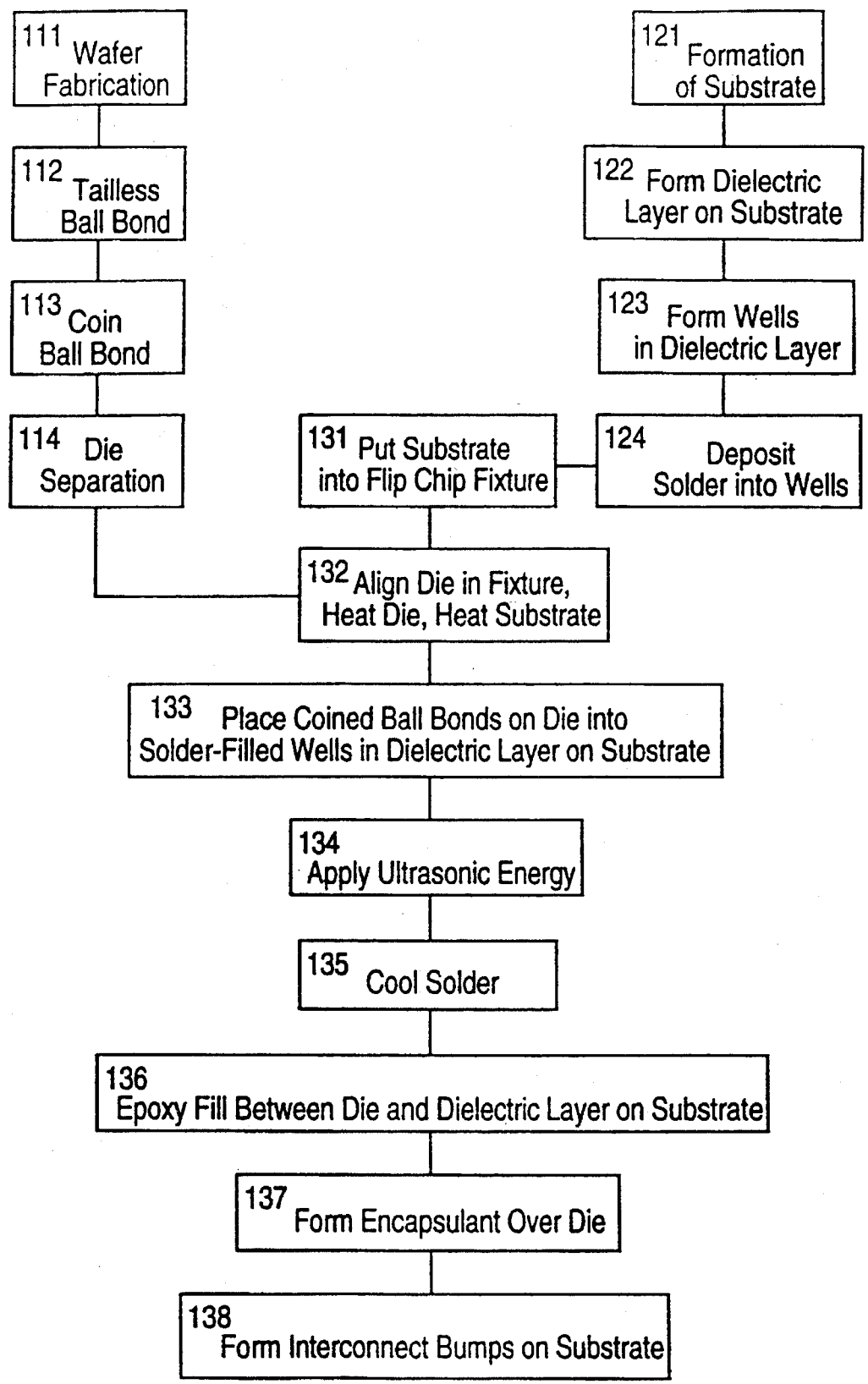
FIG. 1 illustrates a process flow for forming a packaged integrated circuit according to the invention.

According to the invention, an integrated circuit chip (a semiconductor die on which electrically conductive circuitry is formed) is electrically connected to a substrate using a flip chip interconnection. Conventional chips that have been made using wafer fabrication processes for wirebonding chip-level interconnection can be used. Since chips made for wirebonding are more widely available than the bumped chips required for conventional flip chip interconnection, partially packaged integrated circuits according to the invention can be made for a wide variety of applications. Further, there is no need to maintain a separate inventory of chips for wirebonding and flip chip applications. Additionally, since chips for wirebonding applications are typically much cheaper than chips for conventional flip chip applications, the cost of producing chips for flip chip applications is reduced.

Conventional wirebonding equipment can be used to bump chips for use in the invention. This makes production of bumped integrated circuit chips according to the invention easier and cheaper for several reasons. First, conventional wirebonding equipment is cheaper than the equipment used to bump die for a conventional flip chip process (e.g., the C4 process). Second, the predominance of wirebonding in the integrated circuit industry means that there is a lot of existing wirebonding equipment. This existing equipment can be used to bump chips for use with the invention. Third, the amount of time to bump chips using conventional wirebonding equipment is less than the time for bumping chips utilizing the C4 process, thus reducing cost by enabling chips to be processed more quickly.

While being cheaper and easier to implement than the conventional flip chip interconnection, the flip chip interconnection according to the invention also avoids the problems associated with wirebonding chip-level interconnection. Since the bond pads on the chip are connected directly to bonding locations on the substrate, rather than being connected with bond wires, inductances and capacitances associated with the bond wires are eliminated, thus reducing electrical noise in signals sent to and from the chip. Further, the profile (i.e., thickness) of a partially packaged integrated circuit according to the invention is reduced as compared to a comparable wirebonded partially packaged integrated circuit since the bond wires, which may extend above the surface of the chip facing away from the substrate, are eliminated. Additionally, denser packing of chips in multi-chip modules is possible since the space that, in wirebonded partially packaged integrated circuits, would otherwise exist between the chip and the off-chip bonding locations (e.g., substrate bonding locations or leads) is not present in the partially packaged integrated circuits according to the invention. Finally, the possibility that bond wire sweep (i.e., displacement of bond wires that may occur during and as a result of the process for encapsulating the chip) may result in undesirable electrical contact between adjacent bond wires is eliminated since bond wires are not present.

FIG. 1 illustrates a process flow for forming a packaged integrated circuit according to the invention. In FIG. 1, a semiconductor die and a substrate are prepared separately, then attached together to form the packaged integrated circuit.

As shown by block 111, semiconductor dice are formed on a semiconductor wafer using conventional wafer fabrication techniques. The wafer may be of any size. Metallization is patterned on the wafer to form integrated circuitry and bond pads for a plurality of semiconductor dice. The metallization patterns can be formed using, for instance, aluminum. Typically, the metallization pattern formed on dice to be used in flip chip applications is different than the pattern formed on dice that are to be wirebonded. However, according to the invention, a flip chip packaged integrated circuit can be formed using dice that have been patterned in the same manner as dice used for wirebonding applications. Thus, use of the method and structure according to the invention to produce packaged integrated circuits eliminates the need for to separately design and inventory semiconductor die for flip chip and wirebonding applications.

After the metallization patterns are formed on the wafer, the surface of the wafer is passivated. Then, each die on the wafer is probe tested and bad dice are marked.

After identification of bad dice, the good die are "bumped" by forming a tailless ball bond on each bond pad of each good die, as shown by block 112. Forming bumps only on good dice reduces the cost of producing packaged integrated circuits according to the invention.

Figure 2:
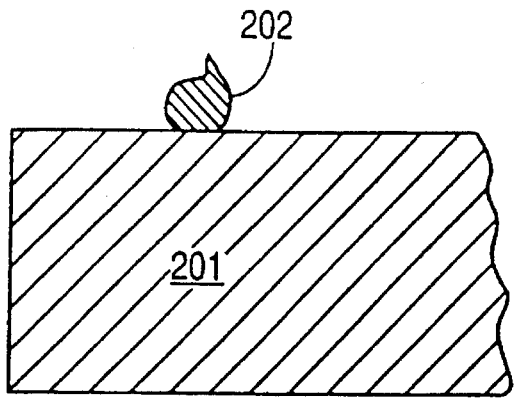
FIG. 2 is a cross-sectional view of a portion of a semiconductor die on which a ball bond is formed.

FIG. 2 is a cross-sectional view of a portion of a semiconductor die 201 on which a ball bond 202 is formed. The ball bond 202 is formed over a bond pad (not shown) which is typically made of aluminum. It is to be understood that, on the entire die 201, there are a plurality of ball bonds 202 formed over selected ones of the bond pads formed on the die 201. The ball bond 202 is made of, for instance, gold or a gold alloy such as gold-palladium or gold-tin.

The ball bonds 202 are formed using a conventional wirebonding process and a conventional wirebonder such as is available as Model 1484 from Kulike and Soffe of Horsham, Pa. The wafer is mounted in a bonding machine. Bond material is fed from a capillary. An electrical spark or combustible gas (e.g., hydrogen) melts the tip of the wire, forming a ball. The capillary moves downward, forcing the formed ball onto a bond pad to form a ball bond. The bond may be formed by thermo-compression (a combination of force applied by the capillary and heat form the bond) or the bond may be formed thermosonically (ultrasonic energy is added to a combination of force from the capillary and heat to form the bond). The gold bond wire material forms an intermetallic bond with the aluminum pad. Note that, in contrast, in the typical C4 interconnection die bumping, it is necessary to provide solderable gold over layers of copper and chromium to adequately bond the solder to the bond pad. After attachment of the ball bond on the inner portion of the lead, the wire is clamped and pulled to break the wire above the ball bond. This pulling and breaking of the wire leaves a small tail at the top of each ball bond 202. The failure of the bond wire to form the tail occurs at different locations for each ball bond so that the tails are formed irregularly on the ball bonds 202.

As shown by block 113 of FIG. 1, after formation of the ball bonds, the ball bonds are then coined. The same equipment is used as in the formation of ball bonds 202 as described above, except that a coining tool is substituted for the capillary. The die 201 is held in the wirebonder tooling fixture so that the surface of the die on which the ball bonds are formed faces toward the coining tool. The coining tool and wafer are heated, or the wafer only may be heated. The coining tool is aligned over each successive ball bond 202, using the wirebonder pattern recognition system, to the true center point of the bond pad on which the ball bond 202 is formed. The coining tool is brought into contact with the ball bond 202 and, a combination of ultrasonic energy, heat and pressure are applied to coin the ball bond as desired, i.e., achieve a desired height and location of the center point of the cone (described below) of the coined ball bond 202.

Figure 3A:
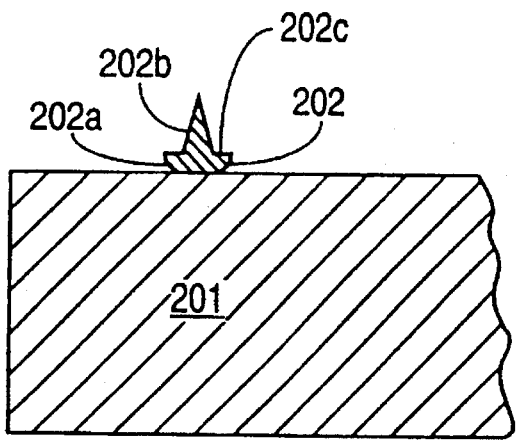
FIGS. 3A and 3B are cross-sectional views of the die and ball bond of FIG. 2 after coining according to alternative embodiments of the invention.
Figure 3B:
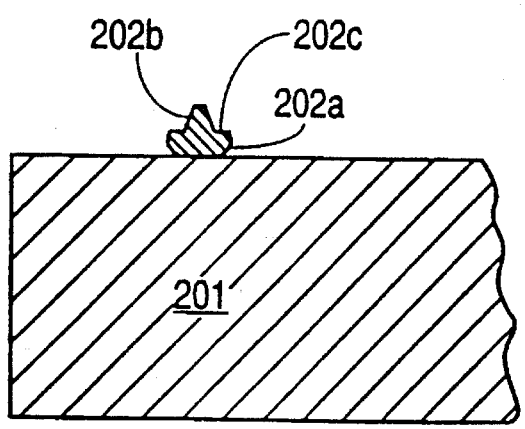

FIGS. 3A and 3B are cross-sectional views of the ball bond 202 after coining according to alternative embodiments of the invention. In each of the embodiments, the coining operation deforms the ball bond 202 such that the ball bond 202 has a base section 202a and a protruding section 202b. A seating plane 202c is formed on the base section 202a and adjoins the base of the protruding section 202b. When the die 201 is attached to a substrate, as described below, the seating plane 202c rests on a surface of the substrate adjacent wells into which the coined ball bonds 202 extend.

In FIG. 3A, the coined ball bond 202 is formed by a coining tool having a conical cross-section, such as described below with respect to FIG. 4A. In FIG. 3B, the protruding section 202b of the coined ball bond 202 has a truncated conical shape as would be formed by a coining tool such as described below with respect to FIG. 4B.

Figure 4A:
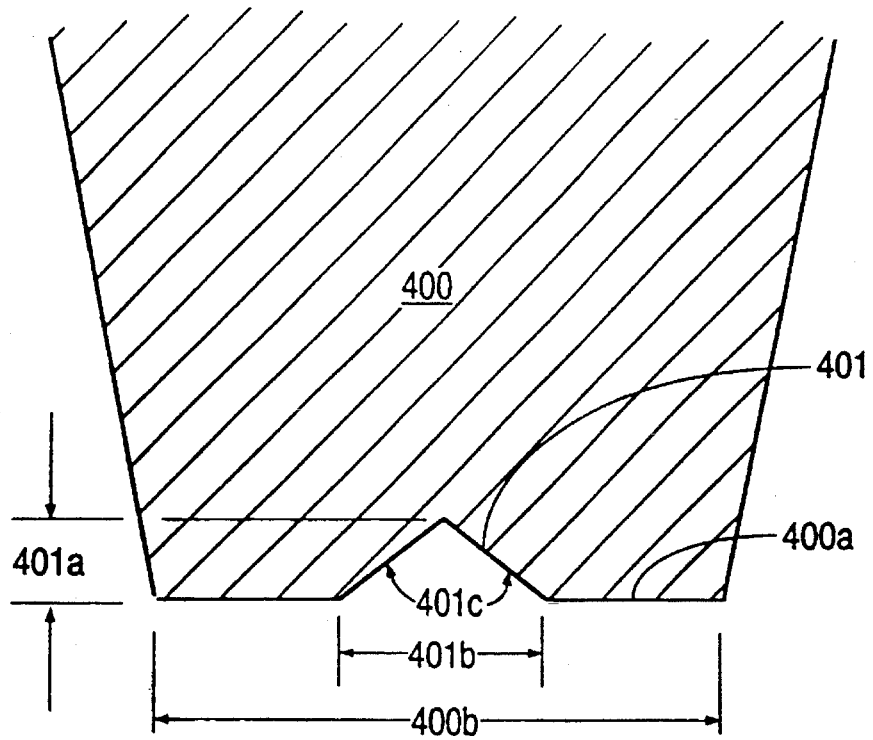
FIGS. 4A and 4B are cross-sectional views of coining tools for use with alternative embodiments of the invention.
Figure 4B:
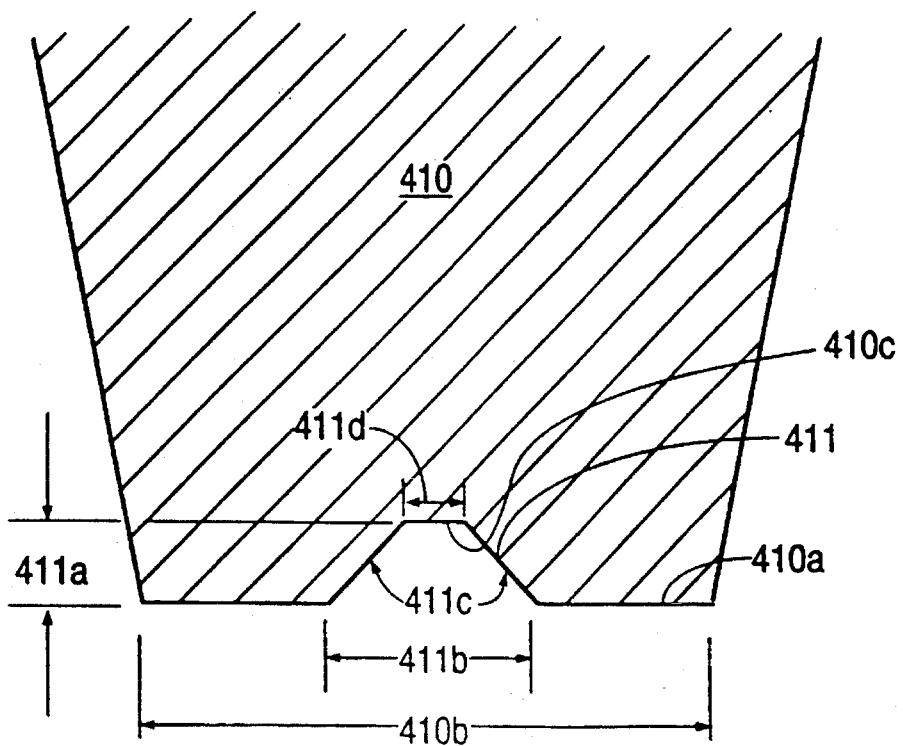

FIGS. 4A and 4B are cross-sectional views of coining tools 400 and 410, respectively, according to alternative embodiments of the invention. Coining tools 400 and 410 each have an indentation 401 or 411, respectively, that contacts the ball bond 202 during the coining operation.

The indentation 401 of FIG. 4A has a generally conical shape. The interior angle 401c of the indentation 401 measures, in one embodiment, between 60°–120° and, in another embodiment, approximately 110°. The width 401b of the indentation 401 at the base surface 400a of the coining tool 400 is made slightly smaller than the diameter of the wells, and, in one embodiment, is approximately 2 mils (51 microns). The height 401a of the indentation 401 from the base surface 400a to the vertex of the indentation interior angle 401c is made slightly smaller than the depth of the wells (i.e., the thickness of the dielectric layer, described below with respect to FIGS. 5A and 5B), and, in one embodiment, is approximately 0.7 mils (18 microns). It is to be understood that, consistent with the dimensions of the wells, other heights 401a and widths 401b can be used.

The indentation 411 of coining tool 410 has a truncated conical shape, i.e., a generally conical shape with a flat top. The interior angle 411c of the indentation 411 measures, in one embodiment, between 60°–120° and, in another embodiment, approximately 110°. The width 411b of the indentation 411 at the base surface 410a of the coining tool 410, and the height 411a of the indentation 411 from the base surface 410a to the flat surface 410c of the indentation 411 are governed by the same considerations as the width 401b and height 401a of the coining tool 400. In one embodiment, the width 411b is approximately 2 mils (51 microns) and the height 411a is approximately 0.7 mils (18 microns). The width 411d at the truncated end of the indentation 411 must be smaller than the width 411b. In one embodiment, the width 411d is between 0.2–1.0 mils (5–25 microns) and, in another embodiment, the width 411d is approximately 0.5 mils (13 microns).

Coining tools having indentations with other shapes can also be used. For example, the cross-section of the indentation can have a curved shape such as a circular, elliptical or parabolic arc.

Both of the coining tools 400 and 410 have a circular cross-section viewed in a direction parallel to the plane of FIGS. 4A and 4B, and perpendicular to surfaces 400a and 410a, respectively. However, it is to be understood that the shape of this cross-section is not critical to the invention and other rounded cross-sections, such as oval, can be used. The diameters 400b and 410b of surfaces 400a and 410a, respectively, are, in one embodiment, 5 mils (177 microns). The diameters 400a and 400b can be any size that is small enough to avoid interference between the coining tool 400 or 410 and ball bonds 202 adjacent the ball bond 202 being coined. The diameters 400a and 400b must also be larger than the widths 401b and 411b of the indentations 401 and 411, respectively.

The use of a coining tool with an indentation as shown, for instance, in FIGS. 4A and 4B allows formation of coined ball bonds having a uniform height (Z-axis) and a precisely located center (X-axis and Y-axis). This control of the coined ball bond geometry is particularly important in view of the irregular size and shape of ball bonds that result from conventional wirebonding equipment. The height of the protruding section of the coined ball bond from the surface of the die can be controlled within a tolerance of less than 0.2 mils (5 microns). The center of the protruding section of each ball bond can be located within a tolerance of 0.08 mils (2 microns) with respect to the center of the bond pad, even if the center of the uncoined ball bond is off-center by as much as 1 mil (25 microns).

As shown by block 114 of FIG. 1, the semiconductor dice with coined ball bonds are then separated by sawing using conventional process and equipment. In an alternative embodiment, the wafer is first sawn to separate the dice and the good die are separated from the bad die. Then, ball bonds are formed on each of the good die and each of the ball bonds are coined, as described above. Each of the die is then attached to a substrate (described in more detail below) by contacting the coined ball bonds to electrically conductive material deposited in wells formed in the substrate.

As shown by block 121 of FIG. 1, a substrate for use with the packaged integrated circuit according to the invention is formed. The substrate can be made of any desired material such as organic laminate, ceramic, alumina or silicon. The substrate can be formed by a conventional printed circuit board process. The substrate can include one or more layers. Each layer can be a layer of electrically conductive material or a layer of electrically insulative material in which electrically conductive regions and/or paths are formed. If the substrate includes more than one layer, the layers can be separated by an electrically insulative adhesive, such as an epoxy resin or polyimide. If desired, vias can be formed by, for instance, mechanical drilling, laser drilling, chemical etching or plasma etching, through one or more of the layers at desired locations to provide electrical interconnection between various layers. Electrically conductive traces are formed in the top layer of the substrate.

Figure 5A:
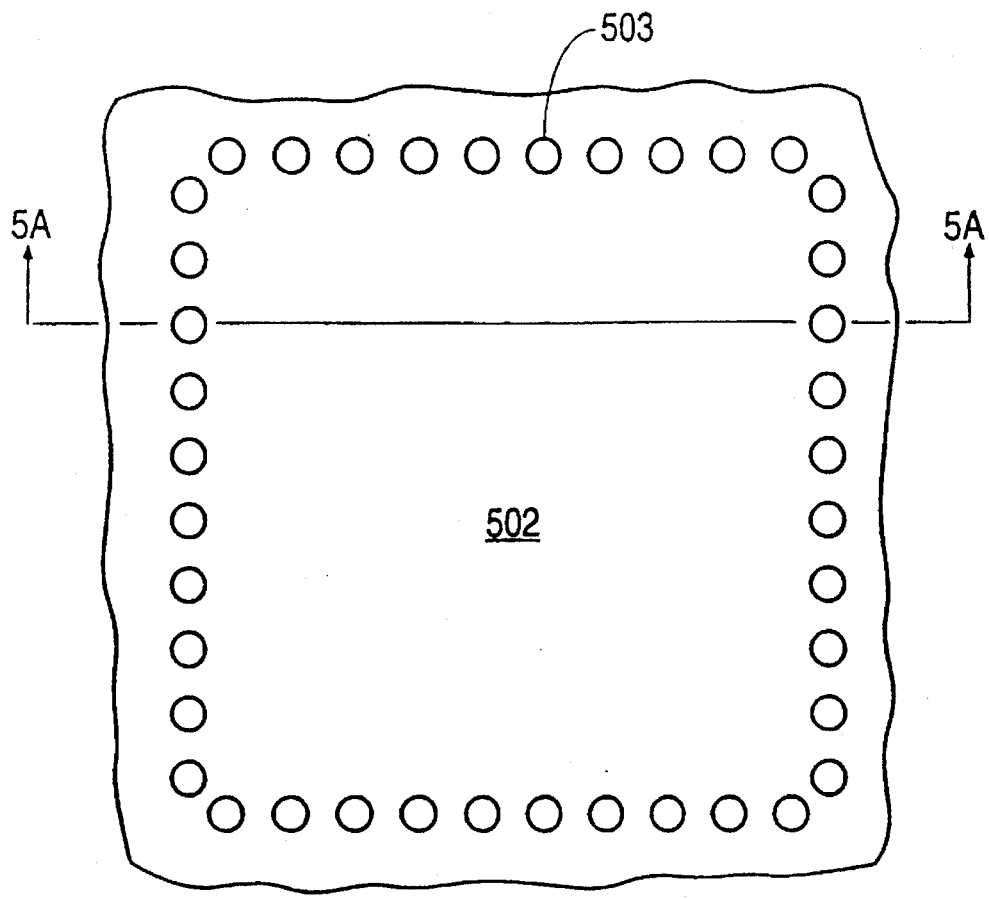
FIG. 5A is a plan view of a portion of a substrate on which a dielectric layer is formed according to the invention.
Figure 5B:
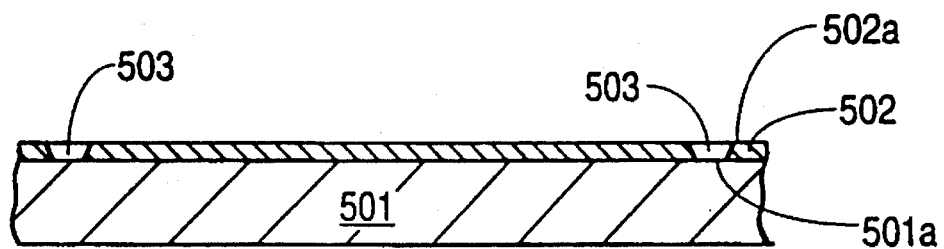
FIG. 5B is a cross-sectional view, taken along section 5A—5A, of the substrate and dielectric layer of FIG. 5A.

FIG. 5A is a plan view of a portion of a substrate 501 on which a dielectric layer 502 is formed. FIG. 5B is a cross-sectional view, taken along section 5A—5A of FIG. 5A, of the substrate 501 and dielectric layer 502. After the substrate 501 has been formed, the dielectric layer 502 which can be, for instance, an epoxy resin or polyimide, is applied using conventional processes such as vacuum lamination, electro-deposition, screening or spraying, to the surface 501a of the substrate 501, as shown by block 122 of FIG. 1. The dielectric layer covers the entire surface 501a. In one embodiment, the thickness of the dielectric layer is approximately 2 mils (51 microns).

As shown by block 123 of FIG. 1, wells are formed through the dielectric layer to the electrically conductive traces formed on the surface 501a of the substrate 501. A plurality of wells 503 are formed through dielectric 502 to surface 501a of substrate 501. The wells 503 are located such that the positions of the wells 503 correspond to the location of the bond pads on die 201. It is to be understood that any number of wells 503 can be formed through dielectric layer 502, depending on the number of bond pads on die 201 to which it is desired to make electrical connection.

The wells 503 can be formed in the dielectric layer 502 by, for instance, chemical etching, plasma etching or laser drilling. Formation of wells 503 by laser drilling is described in a co-pending application entitled "Integrated Circuit Package with Via Interconnection Techniques and Method for Forming Such a Package," Ser. No. 07/893,518, filed Jun. 2, 1992, by Robert C. Marrs and Tadashi Hirakawa and co-owned by the assignee of this invention, the pertinent disclosure of which is incorporated herein. Briefly, the laser fluence (i.e., combination of the duration of time for which the laser energy is applied and the intensity of the laser during the period of application) is controlled so that the laser drills through the dielectric 502 but not through the substrate 501. Formation of the wells by plasma or chemical etching is done using conventional processes.

Figure 6:
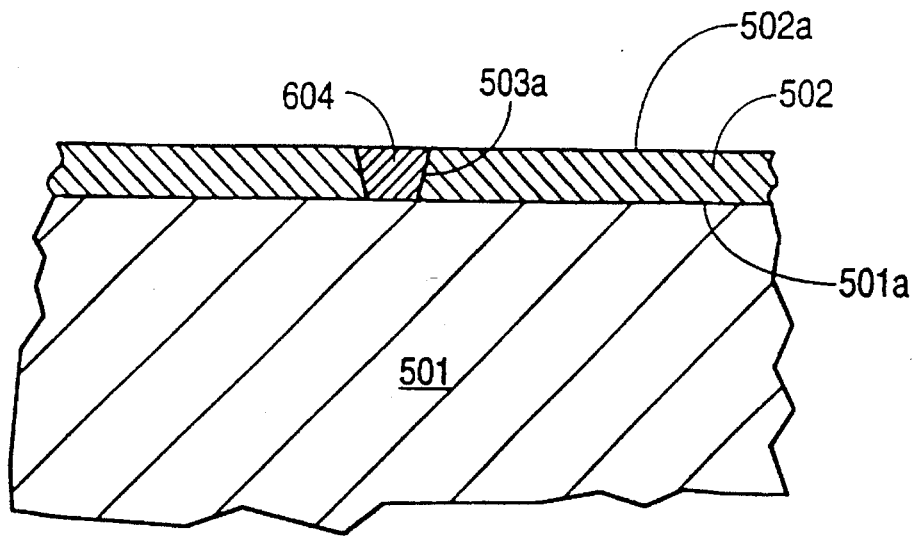
FIG. 6 is a cross-sectional view of a section of the substrate of FIGS. 5A and 5B illustrating in detail a well formed in the dielectric layer and filled with solder.

After the wells 503 are formed, solder is either electroplated or screened into each of the wells 503 using conventional processes, as shown by block 124 of FIG. 1. The solder then cools and solidifies in the wells 503. FIG. 6 is a cross-sectional view of a section of substrate 501 illustrating in detail a well 503 filled with solder 604. The solder 604 can be, for example, a lead-tin alloy. In one embodiment, solder 604 is a lead-tin alloy of 63% lead and 37% tin. However, it is to be understood that a wide range of alloys can be used with the invention.

Figure 7:
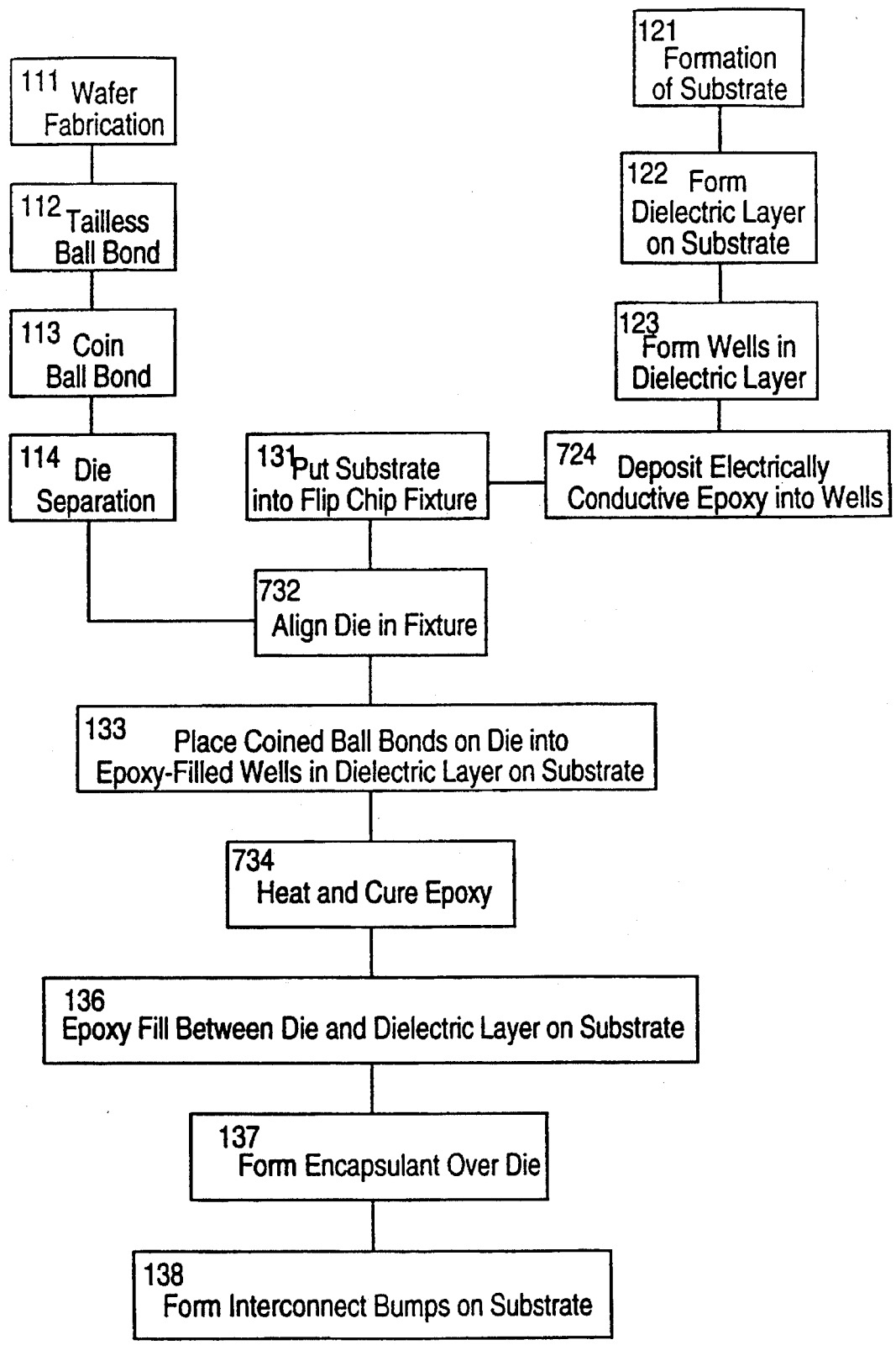
FIG. 7 illustrates a process flow for forming a packaged integrated circuit according to another embodiment of the invention.

In another embodiment of the invention, rather than filling the wells 503 with solder, the wells 503 are filled with an electrically conductive epoxy such as a silver-filled epoxy resin. The epoxy is deposited into the wells 503 at room temperature. FIG. 7 illustrates a process flow for forming a packaged integrated circuit according to this embodiment of the invention (block 724 shows the depositing of conductive epoxy into wells 503). The process flow of FIG. 7 is similar to the process flow of FIG. 1, and like steps are designated by the same numerals. Below, unless a difference is specifically noted, each of the described process steps applies to both the process flow of FIG. 1 and the process flow of FIG. 7.

In one embodiment, the wells 503 are formed with tapered side walls 503a. If the wells 503 are formed by laser drilling, the tapered side walls 503a occur naturally as a result of the laser drilling. If the wells 503 are formed by etching, the tapered side walls 503a are obtained by appropriate control of the etching time, etchant temperature and etchant flow rate. The taper helps center the coined ball bond 202 when the coined ball bond 202 is inserted into the solder-filled well 503, as explained in more detail below. Additionally, the taper of the walls in conjunction with the cone shape of the coined ball bond 202 provides a low stress solder (or conductive epoxy) connection between the die 201 and the substrate 501, as compared to the double solder bump connection used in previous flip chip interconnections.

In other embodiments of the invention, wells having straight side walls can be formed. Wells having straight side walls can be created by etching, e.g., plasma etching.

The wells 503 have a diameter at the surface 502a of the dielectric layer 502 that is slightly smaller than the diameter of the base of the cone section 202b of each of the coined ball bond bonds 202. The outer diameter of the seating plane 202c of each of the coined ball bonds 202 is made slightly larger than the diameter of the wells 503. In one embodiment, the diameter of the wells 503 at the surface 502a is 2.2–2.5 mils (56–64 microns), the diameter of the base of the cone section 202b of each of the coined ball bonds 202 is 1.95–2.05 mils (50–52 microns) and the outer diameter of the seating plane 202c of each of the coined ball bonds 202 is 3.2–3.5 mils (81–89 microns).

Next, as shown in block 131 of FIG. 1, the substrate 501 is placed into a standard flip chip fixture such as the Flip Chip Aligner/Bonder available from Research Devices in West Piscataway, N.J. as Part No. M8B. The flip chip fixture includes a heater that can be used, as explained below, to heat the substrate 501 during attachment of the die 201.

As shown by block 132 of FIG. 1, the die 201 is held in place by the flip chip fixture above the substrate 501 so that the ball bonds 201 are aligned above corresponding wells 503, and the die 201 and substrate 501 are heated. The die 201 is aligned with the substrate 501 using a vision system, as is well known. The substrate 501 is heated to a temperature to melt the solder 604 in wells 503. In one embodiment of the invention in which the solder 604 is an alloy including 63% lead and 37% tin, the substrate 501 is heated to a temperature of 215°–240° C. The die 201 is picked up with a conventional vacuum tool. The vacuum tool holding the die 201 also includes a heater which heats the die 201 to promote wetting of the solder 604 to the surface of the coined ball bond 202. The die is heated to a temperature to approximately match that of the substrate. In the embodiment of the invention in which the solder 604 is an alloy including 63% lead and 37% tin, the die 201 is heated to a temperature of 215°–240° C.

Though, in the description above, the die 201 is heated to a temperature approximately equal to the temperature of the substrate 501, this is not necessary and, in another embodiment of the invention, the die 201 is not heated.

In the embodiment of the invention in which a conductive epoxy is deposited into the wells 503, the die 201 and substrate 501 are not heated at this point. Rather, as shown by block 732 of FIG. 7, the die 201 is aligned in the fixture, using the vision system, without the application of heat.

Figure 8:
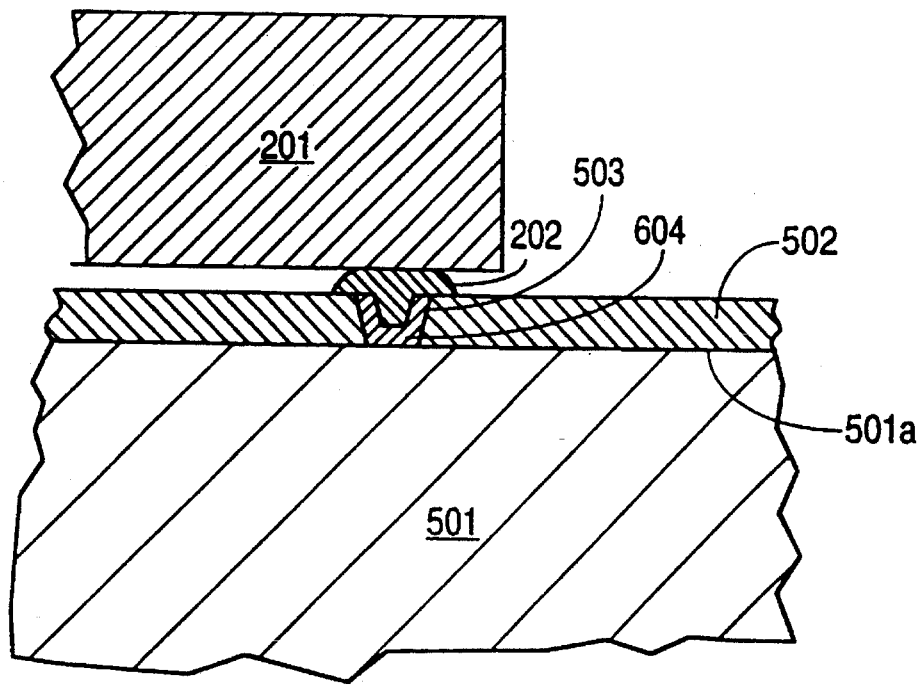
FIG. 8 is a cross-sectional view of a section of the die of FIG. 2 disposed adjacent the dielectric layer of the substrate of FIGS. 5A and 5B, illustrating a coined ball bond pushed down into the solder filling a well formed in the dielectric layer.

As shown by block 133 of FIG. 1, the coined ball bonds 202 are pushed down into the molten solder 604 filling corresponding wells 503. FIG. 8 is a cross-sectional view of a section of the die 201 disposed adjacent the dielectric 502, illustrating a coined ball bond 202 pushed down into the solder 604 filling a well 503.

In another embodiment of the invention, no solder or epoxy is filled into the wells 503. Instead, the coined ball bonds 202 are dipped into solder or conductive epoxy, then inserted into the wells 503.

The protruding section 202b of the coined ball bonds 202 helps to align the coined ball bonds 202 when the coined ball bonds 202 are inserted into the wells 503. If the coined ball bonds 202 are initially misaligned as the coined ball bonds 202 slide into the wells 503, the protruding sections 202b slide against the tapered side walls 503a, moving toward the center of the wells 503 and centering the coined ball bonds 202 in the wells 503.

Additionally, as shown by block 134 of FIG. 1, low level ultrasonic energy can be applied through the vacuum tool to vibrate the die 201 while the coined ball bonds 202 are being held in the molten solder 604 in the wells. 503. This vibration is transmitted from the die through the coined ball bonds 202 to the solder 604. The vibration of the solder 604 causes oxide layers that may be present on the surface of the molten solder 604 to break up, and promotes wetting of the solder 604 to the coined ball bonds 202. The ultrasonic energy and heat applied to the die will also work to clean surface contamination from the coined ball bonds 202. Consequently, a better bond is formed between the solder 604 and the coined ball bonds 202, without the use of conventional fluxes, as is commonly done, which are difficult to clean after soldering and which may corrode aluminum bond pads.

In an alternative embodiment of the invention, a non-corrosive flux could be used which does not require cleaning after soldering.

Instead of, or in addition to, the use of ultrasonic energy to break up surface oxides on the solder 604, hydrogen gas or a hydrogen-nitrogen gas mixture can be flown over the substrate 501 and die 201, during the time when the coined ball bonds 202 on the die 201 are inserted into the molten solder 604 in the wells 503 to further reduce formation of these surface oxides.

In the embodiment of the invention in which a conductive epoxy is deposited into the wells 503, ultrasonic energy is not applied, as shown by the absence of this step in FIG. 7.

Figure 9:
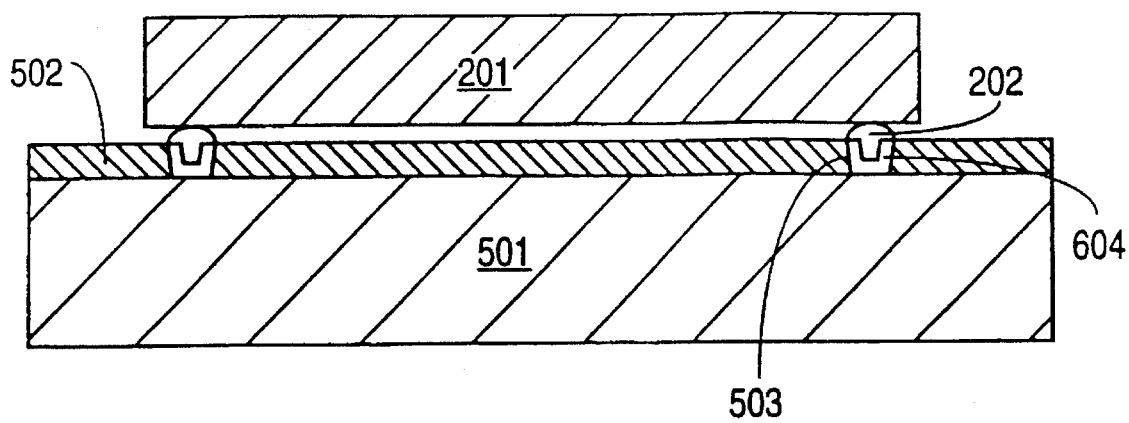
FIG. 9 is a cross-sectional view of the die of FIG. 2 attached to the substrate of FIGS. 5A and 5B.

As shown by block 135 of FIG. 1, after the coined ball bonds 202 have been pushed into the molten solder 604 in wells 503, and ultrasonic energy has been applied, the molten solder 604 is cooled. As the solder 604 cools, the solder 604 solidifies, bonding to the coined ball bonds 202, so that the die 201 is attached to the substrate 501. FIG. 9 is a cross-sectional view of the die 201 attached to the substrate 501 after following the method described above.

As shown by block 734 of FIG. 7, in the embodiment of the invention in which a conductive epoxy is deposited into wells 503, at this point, the epoxy is heated and cured so that the epoxy bonds with the coined ball bonds 202. In one embodiment of the invention, the epoxy is heated to a temperature between 150°–175° C. for a period of 1–2 hours.

Figure 10:
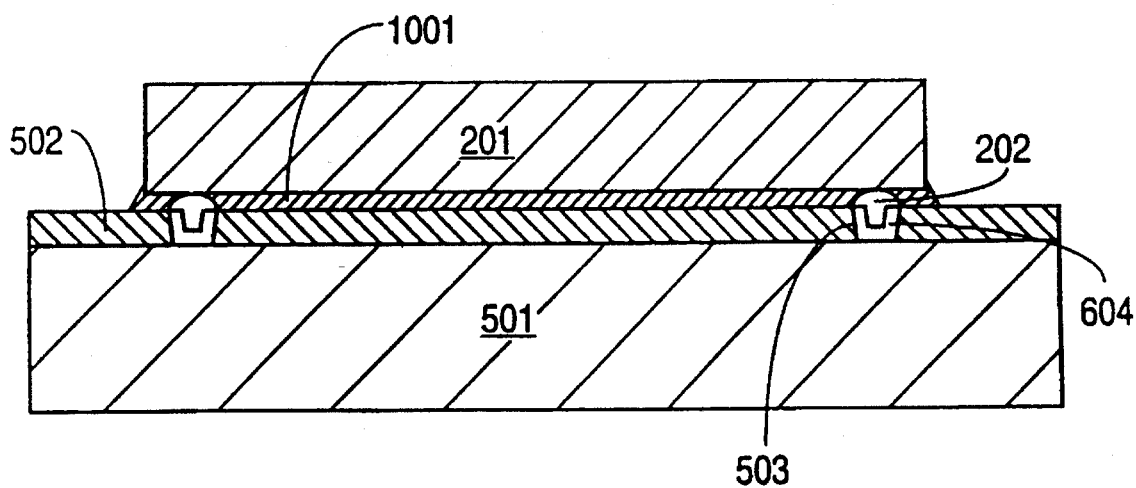
FIG. 10 is a cross-sectional view of the die of FIG. 2 attached to the substrate of FIGS. 5A and 5B with an epoxy filling the region between the dielectric layer and the die.

As shown by block 136 of FIG. 1, after attaching the die 201 to the substrate 501, the open region between the die 201 and dielectric layer 502 is filled with an epoxy. FIG. 10 is a cross-sectional view of the die 201 attached to the substrate 501 with an epoxy 1001 filling the region between the dielectric layer 502 and the die 201. The presence of the epoxy 1001 eliminates air pockets under the die 201 in which moisture and contaminants can be collected. The epoxy 1001 also helps relieve stress on the interconnection between the ball bonds 201 and solder 604.

Figure 11:
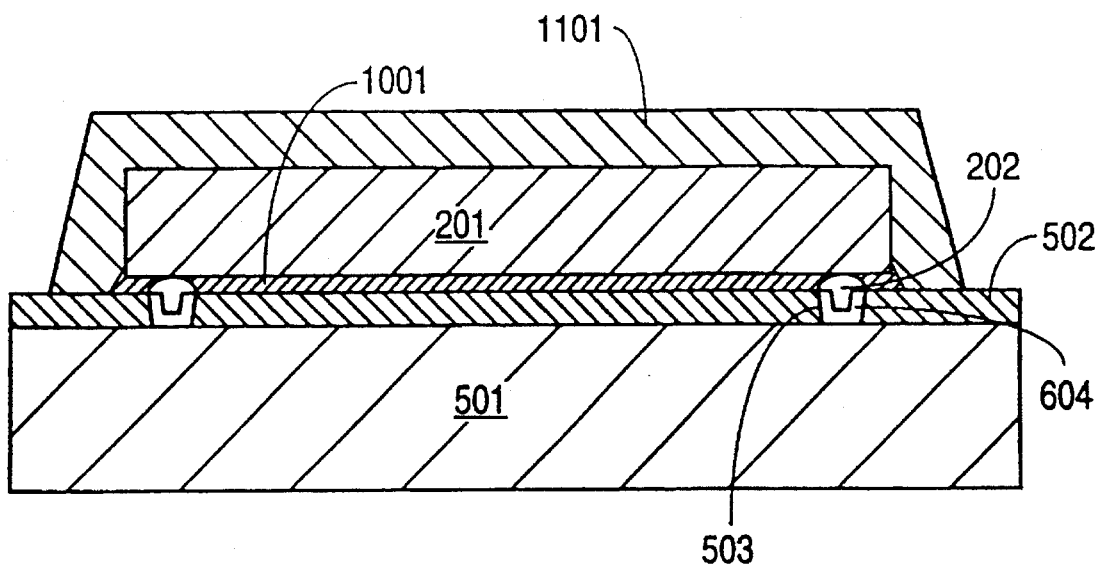
FIG. 11 is a cross-sectional view of the die and substrate of FIG. 10 with a package formed over the die and contacting the dielectric layer to enclose the die from the ambient environment.

As shown by block 137 of FIG. 1, in one embodiment, an encapsulant is formed to enclose the die 201. FIG. 11 is a cross-sectional view of a package 1101 formed over die 201 and contacting the dielectric layer 502 to enclose die 201 from the ambient environment. The package 1101 is formed of, for instance, plastic by, for instance, injection molding, transfer molding or potting. Note formation of an encapsulant to enclose the die 201 as shown by FIG. 11 is not critical to the invention, and, in other embodiments of the invention described below, the die 201 may be encapsulated in another manner.

Figure 12:
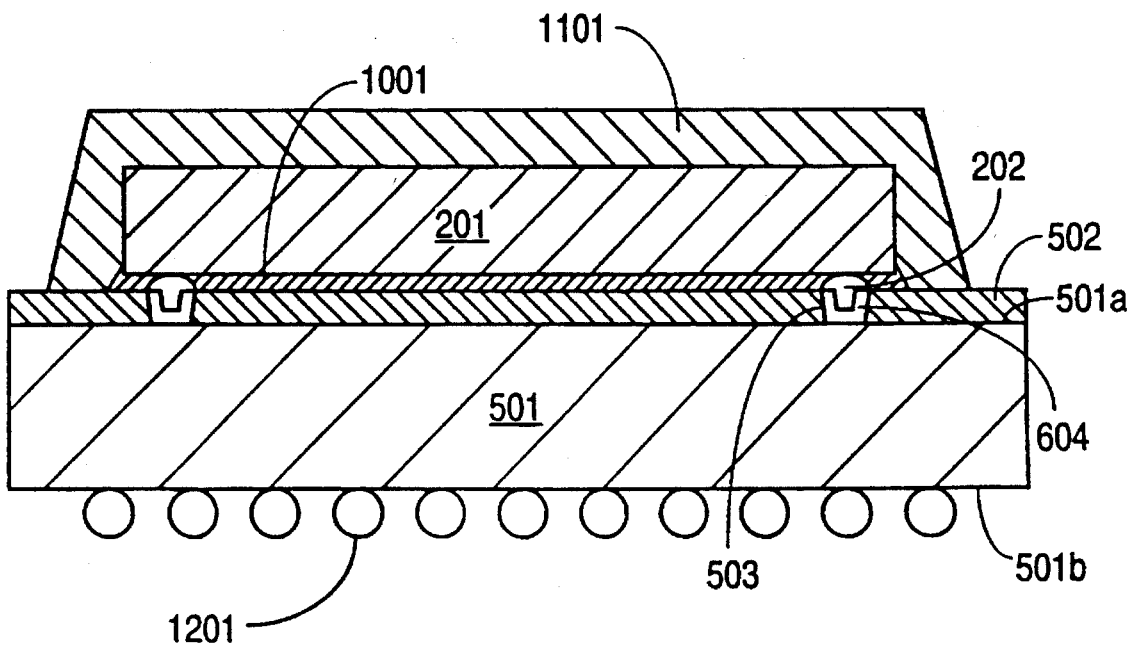
FIG. 12 is a cross-sectional view of the die and substrate of FIG. 11 with interconnect bumps formed on bonding locations on the surface of the substrate.

As shown by block 138 of FIG. 1, interconnect bumps are formed on the surface of the substrate 501 opposite the surface on which the dielectric layer 502 is formed. FIG. 12 is a cross-sectional view of the die and substrate of FIG. 11 with interconnect bumps 1201 formed on bonding locations (not shown) on surface 501b of substrate 501. The bonding locations may be an end of a via (not shown) formed through substrate 501 or an end of a trace formed on surface 501b. The interconnect bumps 1201 are formed of solder according to well-known methods.

The interconnect bumps 1201 are used to make electrical connection between the substrate 501 and other electrically conductive material such as a printed circuit board. The substrate 501 is placed onto the other electrically conductive material such that the interconnect bumps 1201 contact bonding locations on the other electrically conductive material. The interconnect bumps 1201, made of solder, are heated, then cooled to solidify, forming a bond between the substrate 501 and other electrically conductive material.

It is to be understood that the method, shown by block 138 and illustrated in FIG. 12, of electrically connecting the substrate 501 to electrically conductive material not part of the packaged integrated circuit according to the invention is not critical to the invention, and other methods can be used. In these other embodiments of the invention, solder bumps 1201 are not formed on the surface 501b of the substrate 501.

FIG. 13 is a cross-sectional view of the die 201 and substrate 501 as shown in FIG. 10, with the substrate 501 attached to a die attach paddle 1301 of a leadframe with a conventional die attach adhesive (not shown). Leads 1302 of the leadframe are formed around the periphery of the substrate 501. Electrically conductive bond wires 1303 connect an inner portion of the leads 1302 to bonding locations formed on the surface 501a of the substrate 501.

In this embodiment, the package 1101 is not formed to enclose die 201. Rather, the inner portion of the leads 1302, die attach paddle 1301, bond wires 1303, substrate 501, and die 201 are encapsulated in a package 1304 by a method such as transfer or injection molding.

FIG. 14 is a cross-sectional view of the die 201 and substrate 501 as shown in FIG. 10, with the substrate 501 attached to a heat sink 1401 with a conventional die attach adhesive (not shown). Leads 1302 are formed around the periphery of the substrate 501. Though not shown in FIG. 14, the leads 1302 can be attached to the surface 1401b of the heat sink 1401 with a conventional adhesive (not shown). The leads 1302 are wirebonded to bonding locations formed on the surface 501a of the substrate 501.

Again, no package 1101 (FIG. 11) is formed. The inner portions of the leads 1302, heat sink 1401, bond wires 1303, substrate 501 and die 201 are encapsulated in a package 1304 by, for instance, transfer or injection molding. The surface 1401a of the heat sink 1401 opposite the surface 1401b remains exposed outside of the package 1304.

In still another embodiment, bonding locations formed on the surface 501b of the substrate 501 can be attached directly to the inner end of a set of leads of a leadframe. This attachment can be accomplished by forming interconnection vias through the substrate, the location of the vias corresponding to the location of individual leads, by welding or soldering the substrate to a set of leads, or by welding or soldering the substrate to a set of traces on TAB tape.

Various embodiments of the invention have been described. The descriptions are intended to be illustrative, not limitative. Thus, it will be apparent to one skilled in the art that certain modifications may be made to the invention as described without departing from the scope of the claims set out below.

We claim:
1. A method for forming an interconnection between an integrated circuit chip and a substrate, electrically conductive circuitry and a plurality of electrically conductive bond pads being formed on a surface of the integrated circuit chip, electrically conductive material being formed on a first surface of the substrate, a dielectric layer covering the first surface of the substrate including the electrically conductive material, the method comprising the steps of:

forming a series of wells through the dielectric layer to selected portions of the electrically conductive material formed on the first surface of the substrate; forming a ball bond on each of selected ones of the bond pads;

coining each of the ball bonds into an integral one-piece construction having a base section with a circular flange and an integral protruding section extending from a central portion of said flange, the base section having a seating plane in the form of an annular seating surface facing outwardly from the die surface; and placing the integrated circuit chip adjacent the dielectric material such that the surface of the integrated circuit chip is disposed adjacent the dielectric layer and the protruding section of each of the ball bonds extends into a corresponding well to electrically connect to the electrically conductive material formed on the first surface of the substrate and the annular seating surfaces of the ball bonds are seated on the dielectric layer such that a gap exists between the integrated circuit chip surface and the dielectric layer.

2. A method as in claim 1, wherein the step of forming wells through the dielectric layer further comprises forming the wells with laser energy, the intensity and duration of application of the laser energy being controlled such that the laser energy only removes dielectric material.

3. A method as in claim 1, wherein the step of forming wells through the dielectric layer further comprises etching the wells in the dielectric layer.

4. A method as in claim 1, wherein each of the ball bonds is coined with a coining tool which includes an indentation which is generally conical in cross-sectional shape such that the protruding section of each ball bond is coined into a generally conical shape.

5. A method as in claim 1, wherein each of the ball bonds is coined with a coining tool which includes an indentation which is generally a truncated conical shape such that the protruding section of each ball bond is coined into a truncated conical shape.

6. A method as in claim 1, wherein each of the ball bonds is coined to have a protruding section with a vertical cross-sectional shape such that the width of the cross-section at a first distance above the annular seating surface of the ball bond is less than the width of the cross-section at a second distance above the annular seating surface of the ball bond, the first distance being greater than the second distance.

7. A method as in claim 1 comprising the additional steps of:

providing the wells with an electrically conductive solder;

placing the integrated circuit chip adjacent the dielectric material such that the protruding section of each of the coined ball bonds extends into a corresponding well;

reflowing the solder filling the wells; and cooling the electrically conductive solder inside the wells such that the coined ball bonds are held in place and electrical connection is made between each coined ball bond and the corresponding electrically conductive material formed on the surface of the substrate.

8. A method as in claim 1 comprising the additional steps of:

providing the wells with an electrically conductive epoxy in a viscous state; and heating and curing the electrically conductive epoxy inside the wells after the step of placing the integrated circuit chip adjacent the dielectric material such that the coined ball bonds are held in place and electrical connection is made between each coined ball bond and the corresponding electrically conductive material formed on the surface of the substrate.

9. A method as in claim 1, further comprising the step of:

filling the gap between the dielectric layer and the surface of the integrated circuit chip with a filling material.

10. A method as in claim 9 wherein the filling material is a plastic epoxy.

11. The method as in claim 1, wherein each of the wells have a circular diameter and the diameter of the annular seating surface of the coined ball bonds is greater than the diameter of the wells through the dielectric layer.

12. A method for forming a packaged integrated circuit including a semiconductor die and substrate, electrically conductive circuitry and a plurality of electrically conductive bond pads being formed on a surface of the die, the substrate including electrically conductive traces, vias, and/or regions, a layer of dielectric material being formed on a surface of the substrate, the method comprising the steps of:

forming a ball bond on selected ones of the bond pads;

coining each of the ball bonds with a coining tool which has an indentation formed in a base surface, the indentation having a generally conical cross-sectional shape and an interior angle between 60°–120° whereby a coined ball bond is formed having a base section and a protruding section, the base section having a seating plane, the protruding section approximately centrally formed on the seating plane of the base section;

forming wells through the dielectric layer to electrically conductive material formed on the substrate surface, the location of the wells corresponding to the location of the ball bonds on the die;

providing the wells with a hardenable electrically conductive material;

placing the die adjacent the dielectric material such that each of protruding sections of the coined ball bonds extend into the corresponding well; and hardening the electrically conductive material inside the wells such that the coined ball bonds are held in place and electrical contact is made between each coined ball bond and the corresponding electrically conductive material formed on the surface of the substrate.

13. A method as in claim 12, wherein the interior angle of the indentation measures approximately 110°.

* * * * *